(12) United States Patent
Ahn et al.

(10) Patent No.: US 8,022,553 B2
(45) Date of Patent: Sep. 20, 2011

(54) MOUNTING SUBSTRATE AND MANUFACTURING METHOD THEREOF

(75) Inventors: Jin-Yong Ahn, Yongin-si (KR);
Chang-Sup Ryu, Yongin-si (KR);
Byung-Youl Min, Seongnam-si (KR);
Myung-Sam Kang, Daejeon (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 252 days.

(21) Appl. No.: 12/155,555

(22) Filed: Jun. 5, 2008

(65) Prior Publication Data
US 2008/0315431 A1 Dec. 25, 2008

(30) Foreign Application Priority Data

Jun. 19, 2007 (KR) .................. 10-2007-0059988

(51) Int. Cl.
*H01L 23/48* (2006.01)

(52) U.S. Cl. . 257/775; 257/774; 257/773; 257/E23.011; 257/E23.067; 257/E23.145; 257/E21.557; 438/667; 438/666

(58) Field of Classification Search .......... 257/774, 257/773, 775, E23.011, E23.067, E23.145, 257/E21.577; 438/667, 666
See application file for complete search history.

(56) References Cited

U.S. PATENT DOCUMENTS

| | | | | |
|---|---|---|---|---|
| 5,863,835 A | * | 1/1999 | Yoo et al. | 438/666 |
| 2006/0113675 A1 | * | 6/2006 | Chang et al. | 257/763 |
| 2008/0277778 A1 | * | 11/2008 | Furman et al. | 257/713 |

FOREIGN PATENT DOCUMENTS

| | | |
|---|---|---|
| CN | 1938839 | 3/2007 |
| JP | 2006-210524 | 8/2006 |
| JP | 2006-216919 | 8/2006 |

OTHER PUBLICATIONS

Japanese Office Action for corresponding Japanese Patent Application No. 2008-144925 dated Feb. 22, 2011, 2 pages.

* cited by examiner

*Primary Examiner* — N Drew Richards
*Assistant Examiner* — Yu-Hsi Sun

(57) ABSTRACT

A mounting substrate and a method of manufacturing the mounting substrate. The mounting substrate can include an insulation layer, a bonding pad buried in one side of the insulation layer in correspondence with a mounting position of a chip, and a circuit pattern electrically connected to the bonding pad. By utilizing certain embodiments of the invention, the process for stacking a solder resist layer can be omitted, as the bonding pads can be implemented in a form recessed from the surface of the insulation layer. In this way, the manufacturing process can be simplified and manufacturing costs can be reduced. Since the surface of the mounting-substrate on which to mount a chip can be kept flat without any protuberances, the occurrence of voids in the underfill can be minimized. This is correlated to obtaining a high degree of reliability, and leads to a greater likelihood of successful mounting.

1 Claim, 13 Drawing Sheets

MOUNTING SUBSTRATE AND MANUFACTURING METHOD THEREOF

CROSS-REFERENCE TO RELATED APPLICATIONS

This application claims the benefit of Korean Patent Application No. 10-2007-0059988 filed with the Korean Intellectual Property Office on Jun. 19, 2007, the disclosure of which is incorporated herein by reference in its entirety.

BACKGROUND

1. Technical Field

The present invention relates to a mounting substrate and a method of manufacturing the mounting substrate.

2. Description of the Related Art

In accordance with the trends towards higher performance in an electronic component, the package is being produced in smaller sizes and higher densities. This may require higher densities in the mounting substrate, i.e. the interposer, which connects the chip with the main board in a package. Examples of mounting methods currently used in a high-density package include wire bonding and flip bonding. In cases where the number of input/output terminals per unit area is increased, flip bonding can be more desirable, due to advantages in terms of cost, etc.

FIG. 1A is a cross sectional view of a flip chip ball grid array (FCBGA) structure according to the related art, and FIG. 1B is a magnified view of a portion of FIG. 1A. Referring to the drawings, a chip 100 may be electrically connected with the bonding pads 111 by way of bumps 113. The bonding pads 111 may be electrically connected with a circuit (not shown) formed on the insulating substrate. This circuit may be electrically connected with the solder balls 140. The solder balls 140 may be positioned between the insulating substrate 110 and the main board to provide electrical connection between the chip 100 and the main board.

The bonding pads 111 may be formed on one side of the insulating substrate 110. The bonding pads 111 may be formed by a method of forming apertures in a layer of solder resist 112 and performing plating with a conductive material. In this case, however, tolerances in the plating process can cause tolerances in the heights of the bonding pads 111. Then, if a screen-printing method is used to form the bumps 113, the bumps 113 may not be electrically connected with the chip if an insufficient amount of solder is printed. Also, the process of forming the layer of solder resist 112, forming an adhesive or underfill layer 130 and forming the apertures is a complicated process, which may not only require high precision but also increase costs.

SUMMARY

An aspect of the invention is to provide a simpler manufacturing process for a mounting substrate, reduce production costs, and improve the reliability of the mounting process.

Another aspect of the invention provides a mounting substrate, on one side of which a chip may be mounted. The mounting substrate can include an insulation layer, a bonding pad buried in one side of the insulation layer in correspondence with a mounting position of the chip, and a circuit pattern electrically connected to the bonding pad. A surface of the bonding pad can be recessed by a predetermined depth from a surface of the insulation layer.

The bonding pad can include a land, which may be buried in one side of the insulation layer, where a surface of the land can also be recessed from a surface of the insulation layer by a predetermined depth.

The bonding pad can further include a via, which may be electrically connected with the circuit pattern, and which may be buried in the insulation layer in a position corresponding with the land. A surface of the via can be recessed from a surface of the insulation layer by a predetermined depth.

In cases where the bonding pad includes a land and a via, the surfaces of the land and the via can be recessed from the surface of the insulation layer by predetermined depths, where the surface of the via may be recessed more, compared to the surface of the land, from the surface of the insulation layer.

Yet another aspect of the invention provides a method of manufacturing a mounting substrate. The method may include providing an insulation layer on one side of which a circuit pattern may be formed; forming at least one bonding pad, which can be electrically connected with the circuit pattern, in the other side of the insulation layer; and etching the bonding pad such that a surface of the bonding pad is recessed from a surface of the insulation layer by a predetermined depth.

The forming of the bonding pad can include burying at least one land in the other surface of the insulation layer. Also, at least one via can be formed, which may be electrically connected with the circuit pattern, in correspondence with a buried position of the land. The land and the via can be etched such that the surface of the bonding pad is recessed from a surface of the insulation layer by a predetermined depth.

By utilizing certain embodiments of the invention, the process for stacking a solder resist layer can be omitted, as the bonding pads can be implemented in a form recessed from the surface of the insulation layer. In this way, the manufacturing process can be simplified and manufacturing costs can be reduced. Also, since the surface of the mounting substrate on which to mount a chip can be kept flat without any protuberances, the occurrence of voids in the underfill can be minimized. This is correlated to obtaining a high degree of reliability, and leads to a greater likelihood of successful mounting.

Additional aspects and advantages of the present invention will be set forth in part in the description which follows, and in part will be obvious from the description, or may be learned by practice of the invention.

DETAILED DESCRIPTION

Figure 1A:
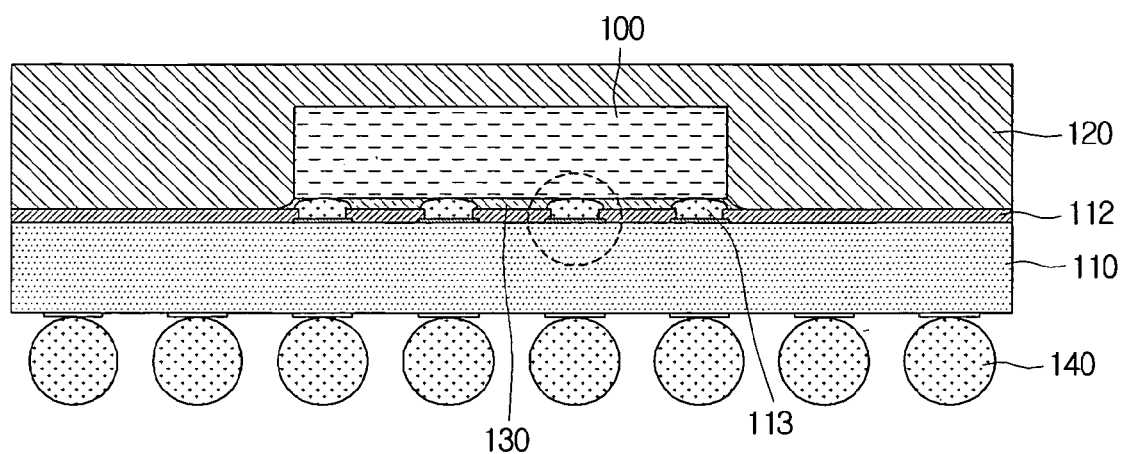
FIG. 1A is a cross sectional view of a flip chip ball grid array (FCBGA) structure according to the related art.

A bump may refer to a portion interposed between a mounting substrate and a chip to provide electrical connection, and is not limited to the form of a solder ball.

A bonding pad is intended to encompass the portions in the mounting substrate that bond to the bump and wire, etc., that provides electrical connection to the chip, and is not necessarily limited to a single independent structure or material. In the descriptions that follow, a bonding pad can be interpreted as encompassing the land and the via, which electrically connect with the bump and wire, etc. The bonding pad can also encompass a corrosion-resistant film that may be formed over the surfaces of the land and via.

The mounting substrate and method of manufacturing a mounting substrate according to certain embodiments of the invention will be described below in more detail with reference to the accompanying drawings. Those elements that are the same or are in correspondence are rendered the same reference numeral regardless of the figure number, and redundant explanations are omitted.

Figure 2A:
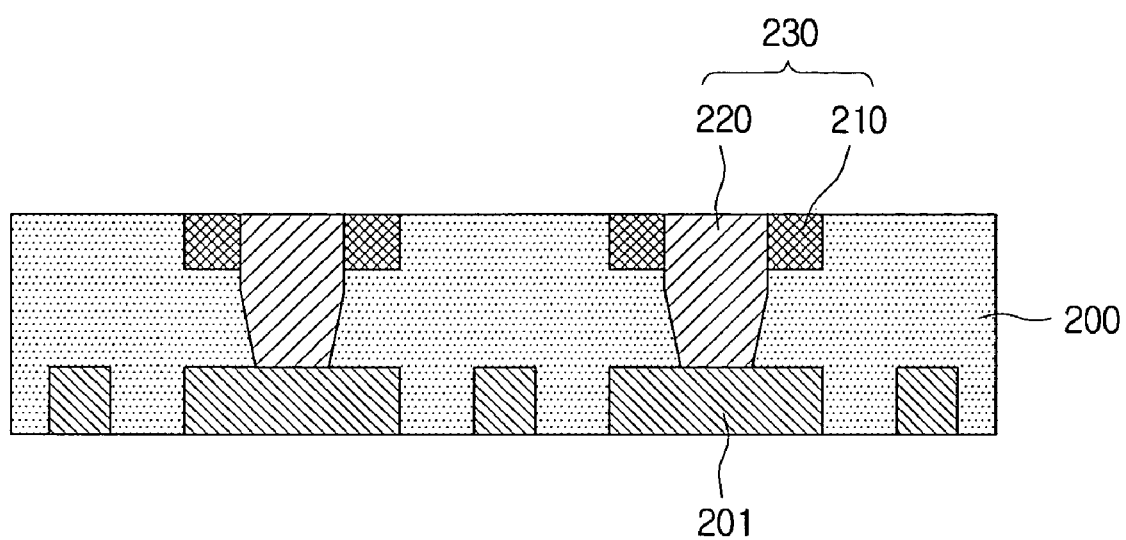
FIG. 2A and FIG. 2B are cross sectional views of a mounting substrate according to a first disclosed embodiment of the invention.
Figure 2B:
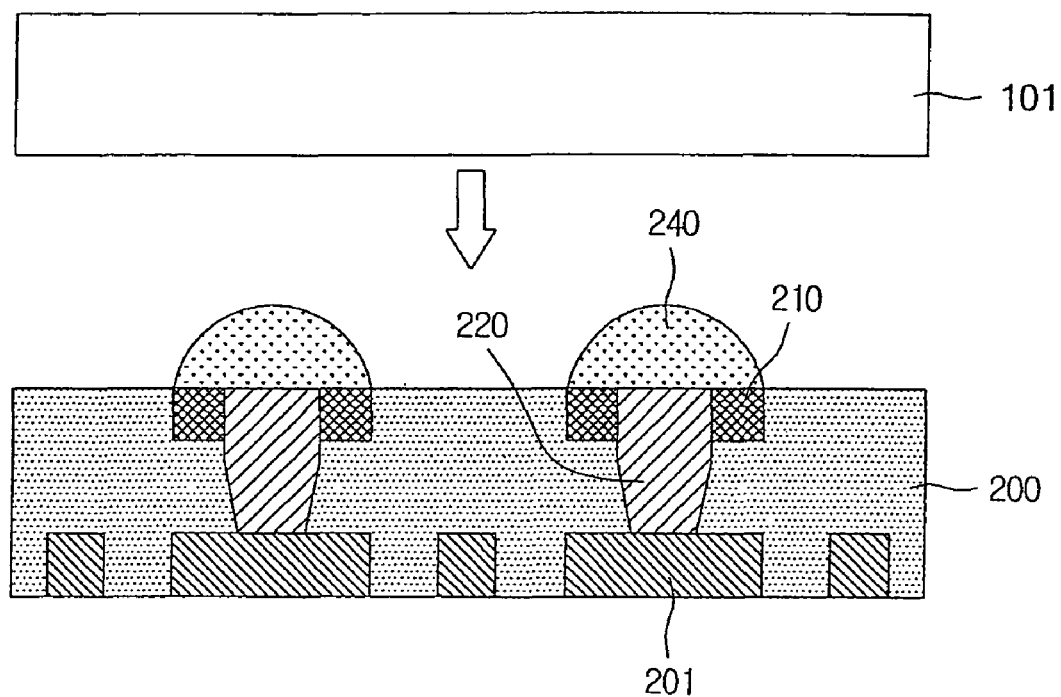

FIG. 2A and FIG. 2B are cross sectional views of a mounting substrate according to a first disclosed embodiment of the invention. In FIGS. 2A and 2B, there are illustrated an insulation layer 200, a circuit pattern 201, lands 210, vias 220, bonding pads 230, bumps 240 and a chip 101.

The insulation layer 200 can be an insulation layer formed on one side of a mounting substrate on which a chip is to be mounted. In cases where the mounting substrate is composed of multiple layers, the insulation layer 200 can form the outermost layer in the side where the chip is to be mounted. The insulation layer 200 may be formed using a method of coating a polyimide resin, epoxy resin, etc. In cases where an additional solder resist layer is not used, the insulation layer 200 can be the outermost layer of the mounting substrate.

The circuit pattern 201 can be located in on one side of the insulation layer 200. In cases where the mounting substrate is composed of multiple layers, another insulation layer can be positioned below the circuit pattern 201. The mounting substrate may be fabricated by a build-up technique using a core substrate, and as such, the insulation layer 200 may also be formed with the circuit pattern 201 formed beforehand on another insulation layer, etc.

The lands 210 can be buried in the other side of the insulation layer 200. A land 210 can be made of a metal (for example, copper). A land can be formed to have an annular shape. The lands 210 may be electrically connected with the vias 220 and may provide a wider contact area between the bonding pads 230 and the bumps 240. A method of forming the lands 210 will be described later with reference to FIGS. 5A to 5F and FIG. 6.

The vias 220 can be formed in the other side of the insulation layer 200 in positions corresponding to the lands. The vias may penetrate the insulation layer to provide electrical connection between the circuit pattern 201 formed in one side of the insulation layer and the lands 210. A via can be made of a metal (for example, copper), and a method of forming the vias 220 will be described later with reference to FIGS. 5A to 5F and FIG. 6.

A bonding pad 230 may include a land 210 and a via 220. In this particular embodiment, the surfaces of a land 210 and a via 220 may be at substantially the same level as the surface of the insulation layer 200. In the example illustrated in FIG. 1, the bonding pads 111 may be surrounded by a solder resist layer 112. In this particular embodiment, however, the insulation layer 200 can serve to separate a bonding pad 230 from adjacent bonding pads 230.

FIG. 2B illustrates bumps 240 and chip 101 formed over the bonding pads 230. The surfaces of the lands 210 and vias 220 can be joined to the bumps 240. The bumps 240 may be formed by a screen-printing method. While in this particular embodiment is illustrated as having the bonding pads electrically connected to chip 101 using bumps, it is also possible to implement the electrical connection using wire bonding.

In certain implementations, the mounting substrate can include just one insulation layer. In this case, the circuit pattern 201 formed in one side of the insulation layer 200 may form input/output terminals, to which solder balls, etc., that provide electrical connection to a main board may be connected.

Figure 3:
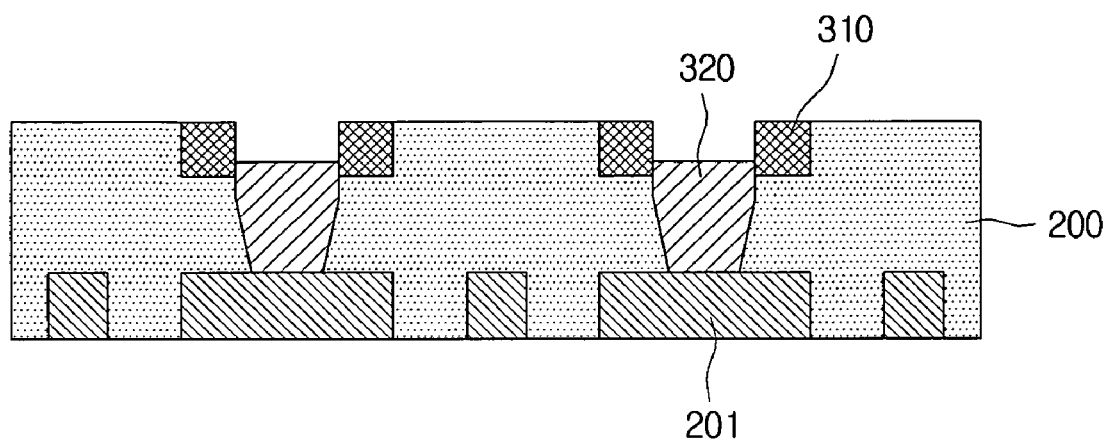
FIG. 3 is a cross sectional view of a mounting substrate according to a second disclosed embodiment of the invention.

FIG. 3 is a cross sectional view of a mounting substrate according to a second disclosed embodiment of the invention. In FIG. 3, there are illustrated an insulation layer 200, a circuit pattern 201, lands 310, and vias 320. Elements denoted by the same reference numerals can be understood from the descriptions for the previously presented drawing.

In this particular embodiment, the surfaces of the vias 320 can be recessed by a particular depth from the surface of the insulation layer, to thereby allow stable coupling between the bumps and wires, etc., and the bonding pads.

The vias 320 can be formed in substantially the same positions and using substantially the same materials as those of the vias 220 illustrated in FIG. 2. The depth by which the surface of a via 320 is recessed can be kept within a range that allows electrical connection with the land 310.

Figure 1B:
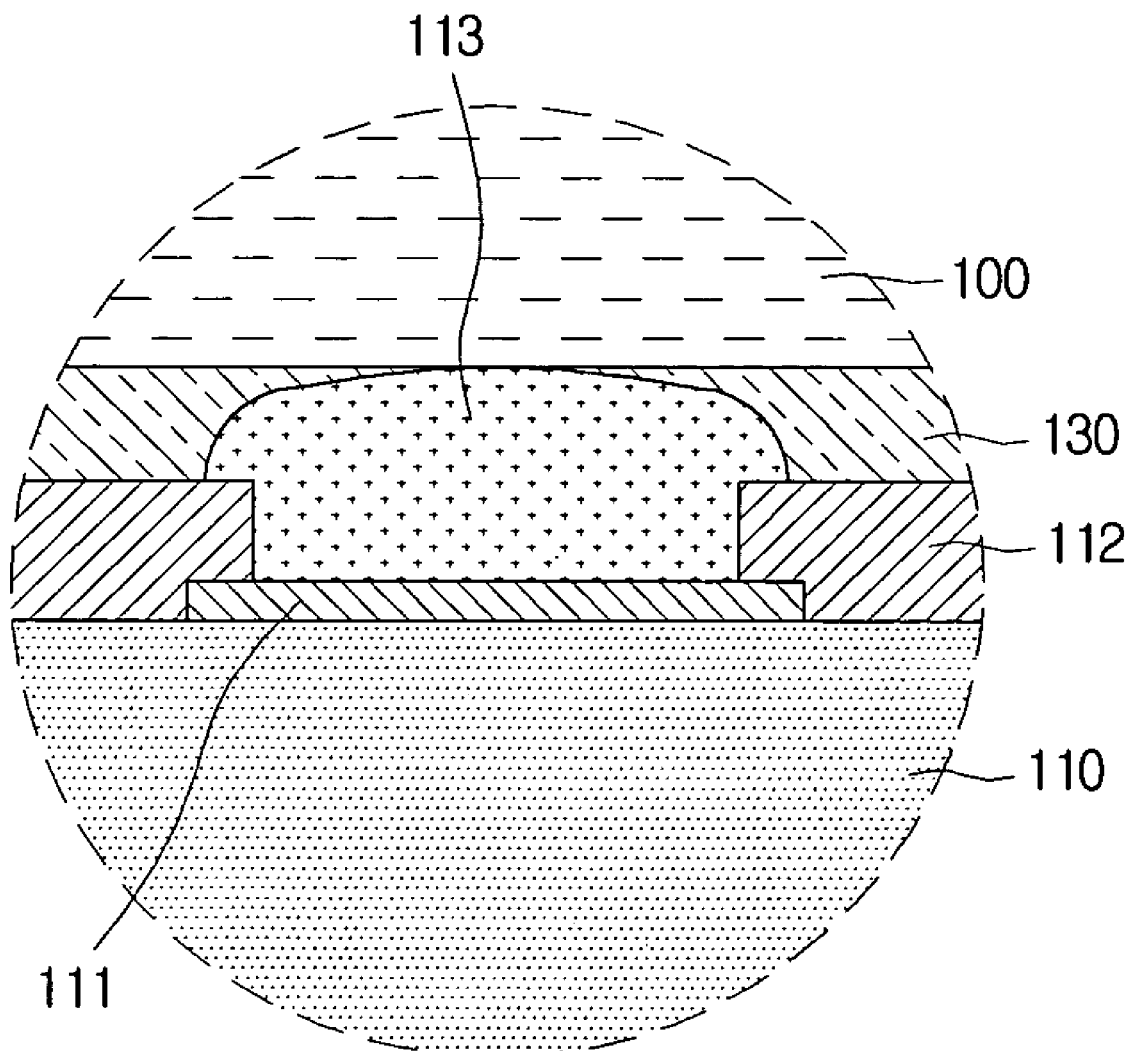
FIG. 1B is a magnified view of a portion of FIG. 1A.

The height difference around the bonding pads 111 provided by the solder resist layer 112 of FIG. 1 may be provided in this embodiment by the lands 310, so that the need for the solder resist layer 112 may be obviated.

The lands 310 can have similar shapes and properties as those of the lands 210 illustrated in FIG. 2. However, if an etching process is used to lower the surfaces of the vias 320 by a particular depth below the surface of the insulation layer 200, the lands 310 may also be affected by the etching process.

In this particular embodiment, the bonding pads may include the lands 310 and the vias 320, and may additionally include a corrosion-resistant film formed over the surfaces of the lands 310 and vias 320. The corrosion-resistant film can be formed by nickel or gold plating.

Figure 4:
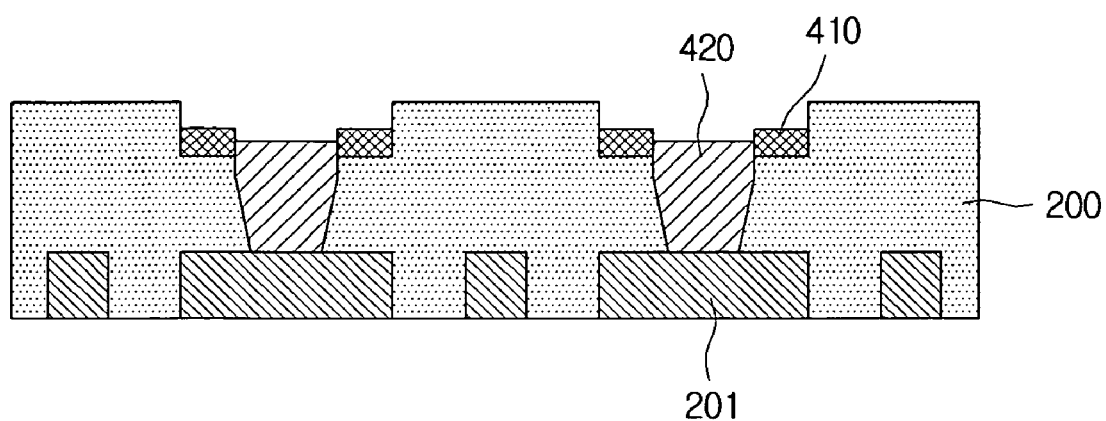
FIG. 4 is a cross sectional view of a mounting substrate according to a third disclosed embodiment of the invention.

FIG. 4 is a cross sectional view of a mounting substrate according to a third disclosed embodiment of the invention. In FIG. 4, there are illustrated an insulation layer 200, a circuit pattern 201, lands 410, and vias 420.

In this particular embodiment, the surfaces of both the lands 410 and vias 420 can be recessed by a particular depth from the surface of the insulation layer, to thereby maintain stable coupling between the bonding pads, which include the lands 410 and the vias 420, and the bumps, etc., as well as to better ensure separation between adjacent bonding pads.

The lands 410 and the vias 420 can be formed by a process of additionally etching the lands 310 and vias 320 illustrated in FIG. 3. Otherwise, the shapes and properties of the lands 410 and vias 420 can be similar to the lands 210, 310 and vias 220, 320 illustrated in FIG. 2 and FIG. 3.

Figure 5A:
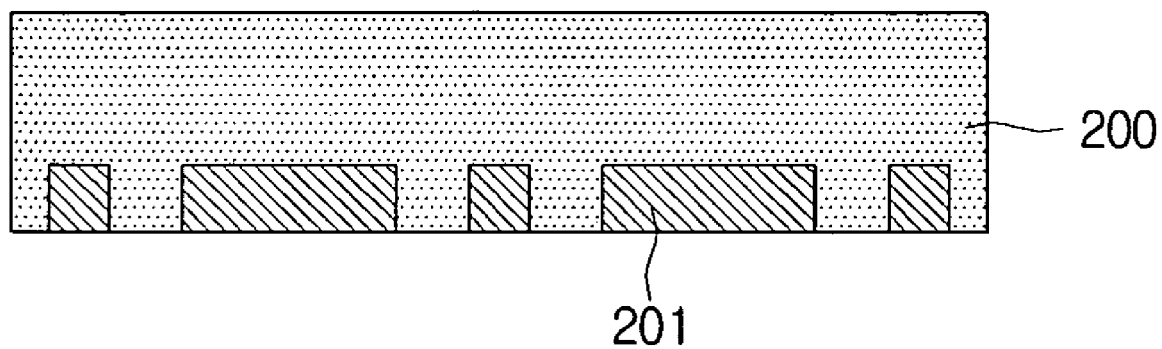
FIG. 5A, FIG. 5B, FIG. 5C, FIG. 5D, FIG. 5E, and FIG. 5F are cross sectional views representing a process diagram for a method of manufacturing a mounting substrate according to a fourth disclosed embodiment of the invention.
Figure 5B:
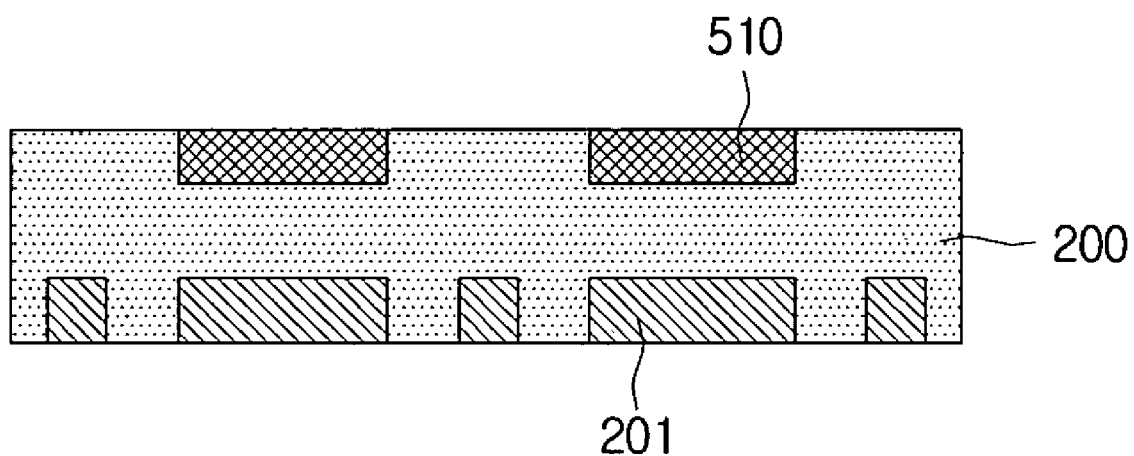
Figure 5C:
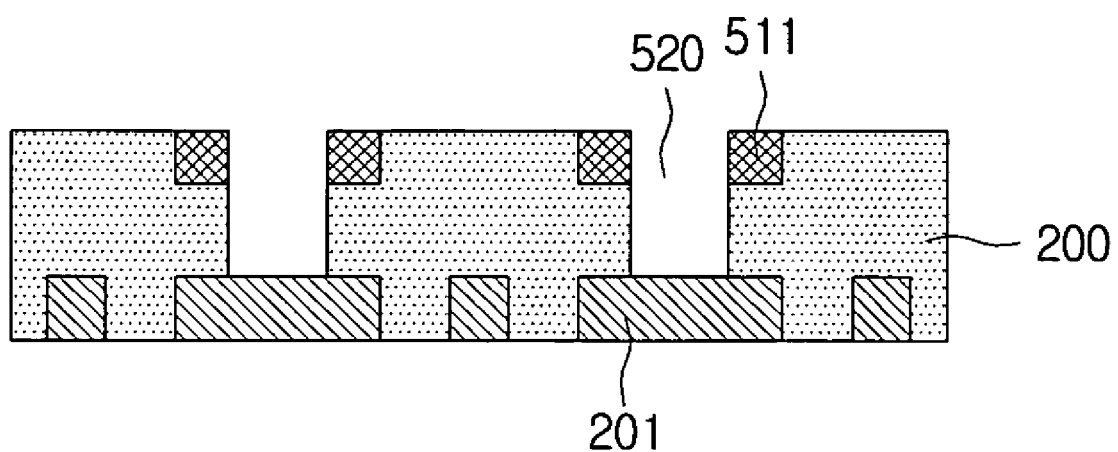
Figure 5D:
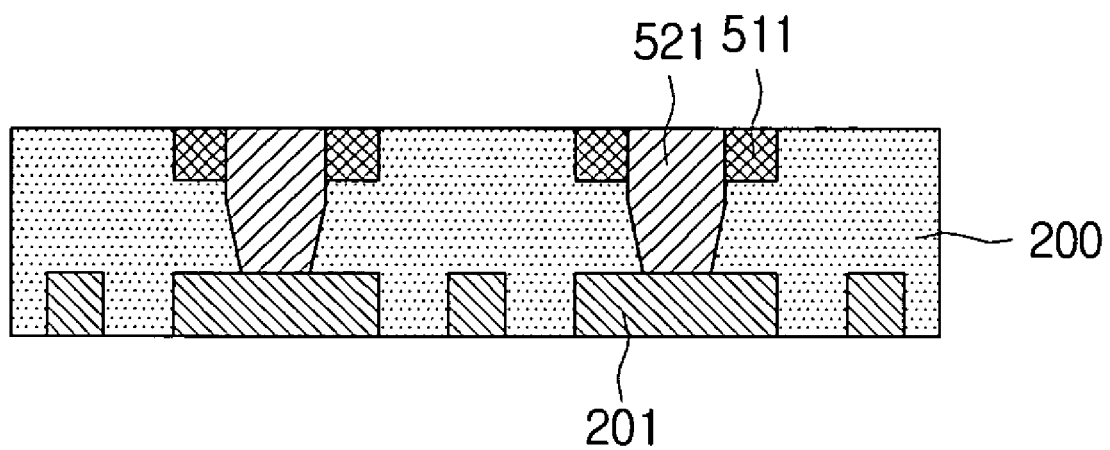
Figure 5E:
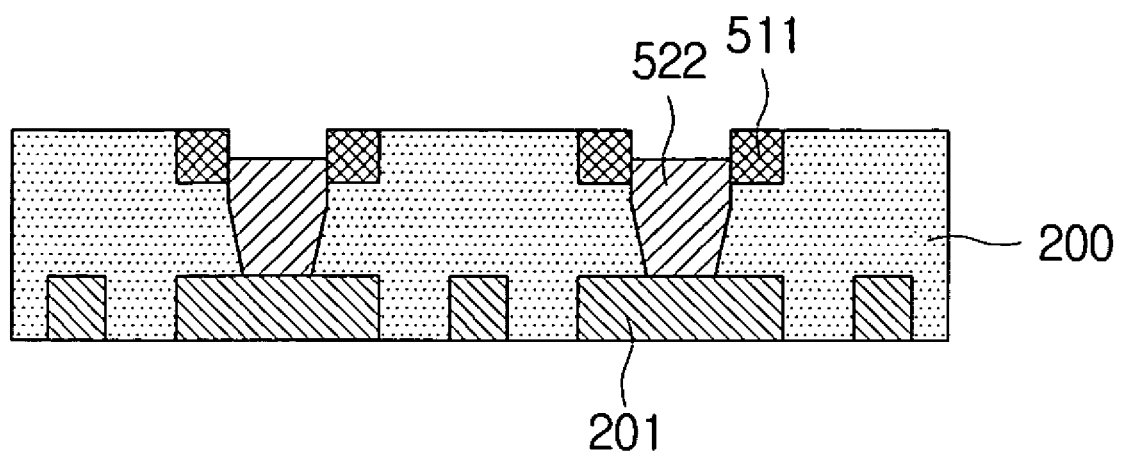
Figure 5F:
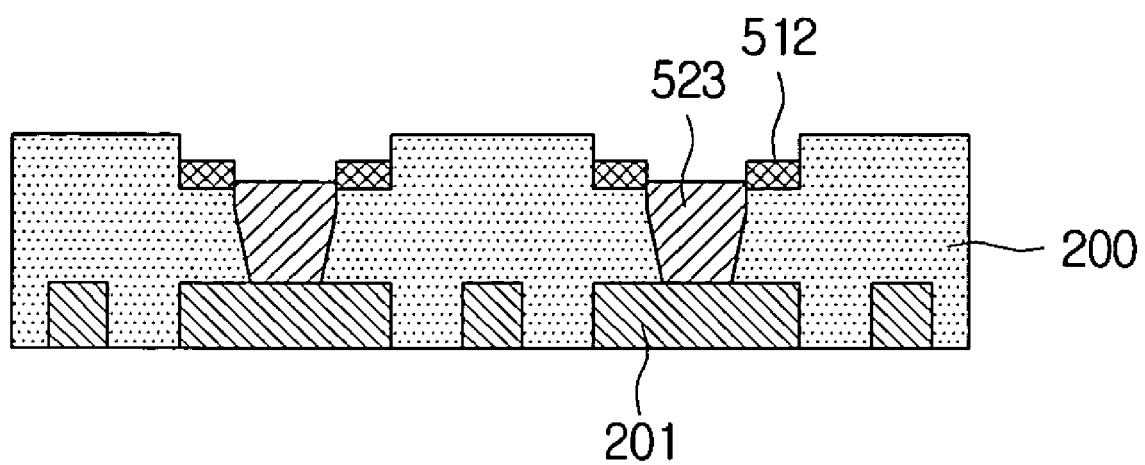
Figure 6:
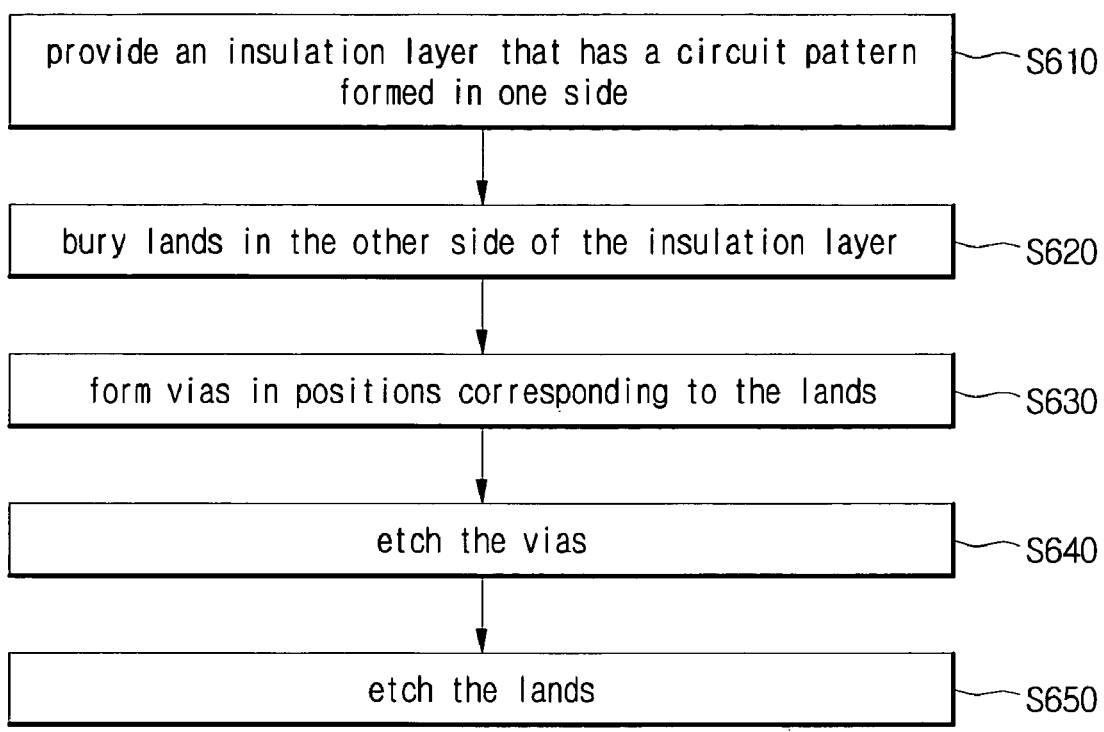
FIG. 6 is a flowchart for a method of manufacturing a mounting substrate according to the fourth disclosed embodiment of the invention.

FIG. 5A through FIG. 5F are cross sectional views representing a process diagram for a method of manufacturing a mounting substrate according to a fourth disclosed embodiment of the invention, while FIG. 6 is a flowchart for a method of manufacturing a mounting substrate according to the fourth disclosed embodiment of the invention. In FIGS. 5A to 5F, there are illustrated an insulation layer 200, lands 510, 511, 512, via holes 520, and vias 521, 522, 523.

The operation of providing an insulation layer having a pattern formed in one side (S610) will first be described with reference to FIG. 5A. As described above, the mounting substrate can be composed of a multiple number of layers, in which case the insulation layer 200 can form the outermost layer where a chip is to be mounted.

It is not necessary to have the insulation layer 200 formed before the circuit pattern 201. The insulation layer 200 can be formed by coating an insulating material, such as of resin, etc., to cover a circuit pattern 201 formed on another layer of the mounting substrate.

The operation of burying lands in the other side of the insulation layer (S620) will now be described with reference to FIG. 5B. The lands 510 can be formed by a method of pressing on a carrier that has a metal pattern formed on one side and then removing the carrier in a subsequent process.

The carrier can be made from materials such as metal, glass, and resin. The forming of a pattern over the carrier may first include a process of forming a seed layer. Although it is not represented in the drawing, the seed layer may partly remain on the surfaces of the lands 510.

The operation of forming vias in positions corresponding to the lands (S630) will now be described with reference to FIGS. 5C and 5D.

The via holes 520 can be formed to penetrate the insulation layer 200 in positions corresponding to the lands 510. The via holes 520 can be formed using laser processing and/or etching.

The vias 521 can be formed by filling the via holes 520 with a conductive material. A metal such as copper, etc., can be filled in the via holes 520. The filling of the conductive material may employ a plating process.

In this particular embodiment, the via holes 520 can be filled completely, after which the vias 521 can be etched in a subsequent process. However, in cases where the vias are formed by partially filling via holes 520, the process of etching the vias can be omitted or simplified.

The operation of etching the vias (S640) will now be described with reference to FIG. 5E. In this operation, the vias 521 can be etched such that the surfaces of the vias 521 are recessed below the surface of the insulation layer 200. In this way, the level difference provided by a solder resist layer in the related art can be provided by the insulation layer 200.

If the vias 521 and the lands 511 are made of the same material, the lands 511 may also be etched by the same etchant. However, if the seed layer remaining on the surfaces of the lands 511 after the process of forming the lands 511 prevents the etching of the lands, the lands can be kept at the same height, even if the same material is used.

The operation of etching the lands (S650) will now be described with reference to FIG. 5F. In this operation, the lands 512 can be etched such that the surfaces of the lands 512 are recessed below the surface of the insulation layer 200.

According to the reactivity of the etcher used in this process, the heights of the vias 523 may be made lower than those of the vias 522 in FIG. 5E.

In certain embodiments, the lands 510, 511, 512 can be made of different materials from those of the vias 521, 522, 523, in which case the etchant for etching each respective element may differ correspondingly. Here, the level difference between the vias and lands can be adjusted by controlling the parameters of the etching process.

Whereas in this particular embodiment, the operation of etching the vias (S640) and the operation of etching the lands (S650) have been described separately, these operations can be performed simultaneously in a single process. If such is the case, one or more etchant suitable for the properties of the lands 510, 511, 512 and vias 521, 522, 523 can be mixed together for use.

By utilizing certain embodiments of the invention, the process for stacking a solder resist layer can be omitted, as the bonding pads can be implemented in a form recessed from the surface of the insulation layer. In this way, the manufacturing process can be simplified and manufacturing costs can be reduced. Also, since the surface of the mounting substrate on which to mount a chip can be kept flat without any protuberances, the occurrence of voids in the underfill can be minimized. This is correlated to obtaining a high degree of reliability, and leads to a greater likelihood of successful mounting.

Many embodiments other than those set forth above can be found in the appended claims.

While the spirit of the invention has been described based on particular embodiments, the skilled person will understand that the invention can be implemented in various modified forms without departing from the spirit of the invention. Therefore, the embodiments set forth above are not to be viewed as limiting the invention but as explaining the invention. The scope of the invention is set forth in the appended claims, where variations of the invention are to be seen as encompassed in the invention disclosed herein.

What is claimed is:

1. A mounting substrate having a chip mounted on one side thereof, the mounting substrate comprising:
   an insulation layer;
   a bonding pad comprising a land and a via, the land being buried in one side of the insulation layer in correspondence with a mounting position of the chip, and the via being buried in the insulation layer in a position corresponding with the land; and
   a circuit pattern formed in an other side of the insulation layer and electrically connected to the via,
   a surface of the land being recessed from a surface of the insulation layer by a predetermined depth, and
   a surface of the via being recessed more than the surface of the land from the surface of the insulation layer.

* * * * *